United States Patent
Uemura et al.

(10) Patent No.: US 8,421,503 B2
(45) Date of Patent: Apr. 16, 2013

(54) LATCH CIRCUIT

(75) Inventors: Taiki Uemura, Yokohama (JP);
Yoshiharu Tosaka, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 285 days.

(21) Appl. No.: 12/715,815

(22) Filed: Mar. 2, 2010

(65) Prior Publication Data

US 2010/0225356 A1 Sep. 9, 2010

(30) Foreign Application Priority Data

Mar. 6, 2009 (JP) .................................. 2009-53929

(51) Int. Cl.
*H03K 19/094* (2006.01)
*H03K 3/356* (2006.01)

(52) U.S. Cl.
USPC .............. 326/121; 326/95; 327/210; 327/208; 327/218; 365/156

(58) Field of Classification Search .................. 326/121, 326/95, 98, 119; 327/210, 208, 218; 365/156, 365/154
See application file for complete search history.

(56) References Cited

U.S. PATENT DOCUMENTS

| | | | | |
|---|---|---|---|---|
| 6,327,176 | B1 * | 12/2001 | Li et al. ........................... | 365/156 |
| 6,614,257 | B2 * | 9/2003 | Knowles ............................ | 326/9 |
| 6,642,802 | B2 * | 11/2003 | Knowles et al. .................. | 331/57 |
| 7,038,515 | B2 * | 5/2006 | Rusu et al. ....................... | 327/208 |
| 8,330,494 | B2 * | 12/2012 | Uemura ........................ | 326/103 |
| 2002/0017924 | A1 * | 2/2002 | Knowles ........................ | 326/119 |
| 2002/0074609 | A1 | 6/2002 | Maruyama | |
| 2006/0087355 | A1 | 4/2006 | Petersen | |
| 2006/0103442 | A1 * | 5/2006 | Krueger ........................ | 327/208 |
| 2007/0268054 | A1 | 11/2007 | Uemura et al. | |

FOREIGN PATENT DOCUMENTS

| | | |
|---|---|---|
| JP | 2000-216668 A | 8/2000 |
| JP | 2002-185309 A | 6/2002 |
| JP | 2006-129477 A | 5/2006 |
| JP | 2007-312104 A | 11/2007 |

* cited by examiner

*Primary Examiner* — Daniel D Chang
(74) *Attorney, Agent, or Firm* — Westerman, Hattori, Daniels & Adrian, LLP

(57) ABSTRACT

A latch circuit includes an input part receiving an external input signal; a plurality of CMOS inverter circuits divided into a first group that includes a first CMOS inverter circuit and a second CMOS inverter circuit outputting inverted data with respect to the input signal, and a second group that includes a third CMOS inverter circuit and a fourth CMOS inverter circuit outputting the same data as the input signal; and a feedback path through which the input signal is fed back to the input part via the plurality of CMOS inverter circuits, wherein a second-polarity drain belonging to one of the first CMOS inverter circuit and the second CMOS inverter circuit is arranged between a first-polarity drain belonging to the first CMOS inverter circuit and a first-polarity drain belonging to the second CMOS inverter circuit.

8 Claims, 14 Drawing Sheets

FIG.6

|         | Node11n | Node12n | Node21n | Node22n | Node11p | Node12p | Node21p | Node22p |
|---------|---------|---------|---------|---------|---------|---------|---------|---------|
| Node11n |         | ERR     | NO      | NO      | NO      | NO      | NO      | ERR     |
| Node12n | ERR     |         | NO      | NO      | NO      | NO      | ERR     | NO      |
| Node21n | NO      | NO      |         | ERR     | ERR     | NO      | NO      | NO      |
| Node22n | NO      | NO      | ERR     |         | NO      | ERR     | NO      | NO      |
| Node11p | NO      | NO      | ERR     | NO      |         | ERR     | NO      | NO      |
| Node12p | NO      | NO      | NO      | ERR     | ERR     |         | NO      | NO      |
| Node21p | NO      | ERR     | NO      | NO      | NO      | NO      |         | ERR     |
| Node22p | ERR     | NO      | NO      | NO      | NO      | NO      | ERR     |         |

FIG.7

|        | Node3p | Node3n |
|--------|--------|--------|
| Node3p |        | NO     |
| Node4p | NO     | NO     |
| Node5p | ERR    | NO     |
| Node6p | NO     | ERR    |
| Node3n | NO     |        |
| Node4n | NO     | NO     |
| Node5n | NO     | ERR    |
| Node6n | ERR    | NO     |

FIG.8

| | | |
|---|---|---|
| Node21n | Node11p | Node21p | NO |
| Node21n | Node11p | Node11n | NO |
| Node21n | Node22n | Node21p | NO |
| Node21n | Node22n | Node22p | NO |
| Node21p | Node12n | Node12p | NO |
| Node21p | Node12n | Node21n | NO |
| Node21p | Node22p | Node21n | NO |
| Node21p | Node22p | Node22n | NO |

FIG.9

| Node3p | Node5p | Node3n |
|--------|--------|--------|
| Node3p | Node5p | Node5n |
| Node3p | Node6n | Node3n |
| Node3p | Node6n | Node6p |
| Node3n | Node6p | Node3p |
| Node3n | Node6p | Node6n |
| Node3n | Node5n | Node3p |
| Node3n | Node5n | Node5p |

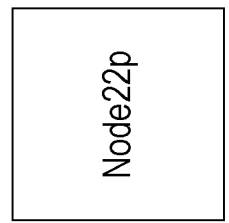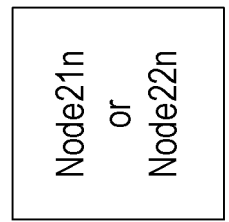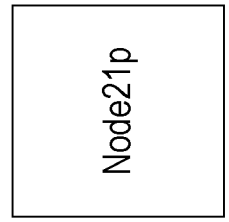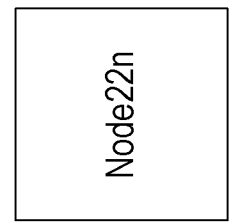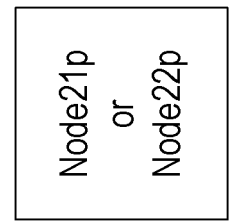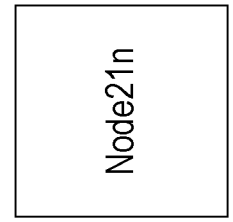
FIG.10A  FIG.10B

LATCH CIRCUIT

CROSS-REFERENCE TO RELATED APPLICATIONS

This application is based upon and claims the benefit of priority of the prior Japanese Patent Application No. 2009-53929, filed on Mar. 6, 2009, the entire contents of which are incorporated herein by reference.

FIELD

The present invention relates to a technology to suppress the occurrences of soft errors in a latch circuit.

BACKGROUND

It is known that electrical noise occurs in large scale integration (LSI) semiconductor circuits because of, for example, the presence of alpha (α) rays or neutron beams that cause the semiconductor circuits to malfunction. The α rays are emitted when radioisotopes included in the packages, wiring, etc. of the LSI semiconductor circuits have decayed, and the neutron beams originate from cosmic rays. The above malfunction is called a soft error in contrast to a hard error caused by a failure of hardware in a semiconductor circuit or the like. Accordingly, the soft error differs from the hard error in that the soft error causes transient malfunction in which the operation of the semiconductor circuit can be recovered while the hard error causes permanent destruction at a specific part in the circuit.

However, if the transient malfunction caused by the soft error is stored in a latch circuit making up the LSI semiconductor circuit, the malfunction caused by the soft error may cause a fixed error in the semiconductor circuit.

The increasing integration and decrease in size of LSI semiconductor circuits reduce the charge capacities of storage nodes of latch circuits included in the LSI semiconductor circuits to increase the probability of soft errors caused by occurrences of electrical noises becoming fixed errors. This is because the logical states of the storage nodes of the latch circuits are apt to reverse due to the electrical noise to increase the frequency of the malfunction states.

Under such situations, approaches to improve the soft-error resistance of logic LSI circuits including latch circuits have been proposed in recent years. For example, a method of determining the output by a decision of the majority of signals output from three or more latch circuits receiving the same data is proposed. However, with this method of avoiding errors, the number and area of circuits are increased because of the three or more latch circuits, a majority circuit, and so on to cause a reduction in the circuit performance. In addition, such a latch circuit in the related art can keep the normal output if a soft error occurs at a single node but cannot keep the normal output if soft errors continuously occur before new data is input. This is because the output is determined on the basis of the majority rule.

In order to reduce the effects of the above problems, a latch circuit including multiple circuit units and feedback paths through which and the multiple circuit units the input is fed back to the input is known. Complementary metal oxide semiconductor (CMOS) inverter circuits are generally used as the circuit units. In each of the CMOS inverter circuits, inverter circuits, particularly, P-channel transistor (PTr) and N-channel transistor (NTr) are coupled in series to each other.

Accordingly, it is desired to realize a latch circuit having an improved soft-error resistance.

SUMMARY

According to one aspect of the invention, a latch circuit includes an input part receiving an external input signal; a plurality of CMOS inverter circuits divided into a first group that includes a first CMOS inverter circuit and a second CMOS inverter circuit outputting inverted data with respect to the input signal, and a second group that includes a third CMOS inverter circuit and a fourth CMOS inverter circuit outputting the same data as that of the input signal; and a feedback path through which a the input signal is fed back to the input part via the plurality of CMOS inverter circuits, wherein a second-polarity drain belonging to one of the first CMOS inverter circuit and the second CMOS inverter circuit is arranged between a first-polarity drain belonging to the first CMOS inverter circuit and a first-polarity drain belonging to the second CMOS inverter circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 illustrates a case in which the held data is changed if soft errors occur in two nodes in the latch circuit in FIG. 2;

FIG. 7 illustrates a case in which the held data is changed if soft errors occur in two nodes in the latch circuit in FIG. 5;

FIG. 8 illustrates a case in which the held data is changed if soft errors occur in two nodes but the held data is not changed if soft errors occur in three nodes in the latch circuit in FIG. 2;

FIG. 9 illustrates a case in which the held data is changed if soft errors occur in two nodes but the held data is not changed if soft errors occur in three nodes in the latch circuit in FIG. 5;

FIGS. 10A and 10B illustrate examples of the basic arrangement of nodes according to embodiments of the present invention;

DETAILED DESCRIPTION OF THE EMBODIMENTS

Figure 1A:
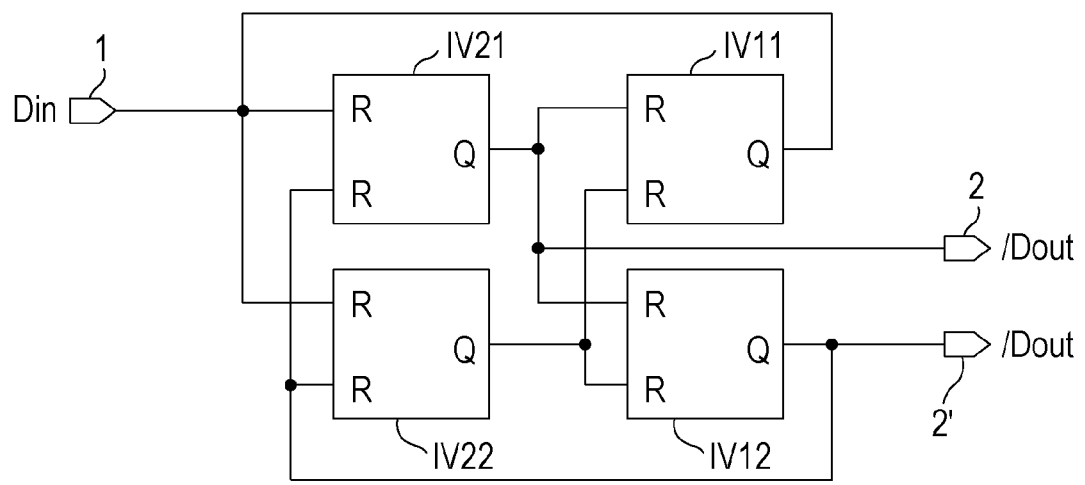
FIG. 1A illustrates an example of the configuration of a latch circuit having a soft-error resistance and FIGS. 1B and 1C illustrate exemplary CMOS inverter circuits.
Figure 1B:
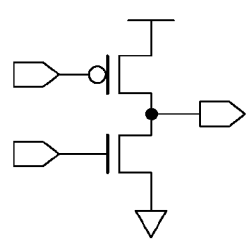
Figure 1C:
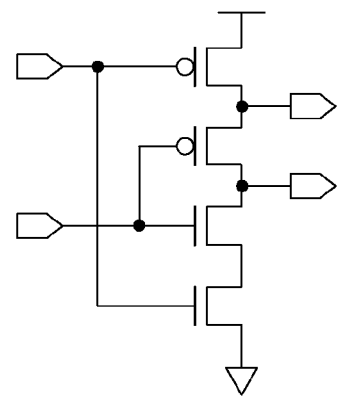

Embodiments of the present invention will herein be described with reference to the attached drawings. FIG. 1A illustrates an example of the configuration of a latch circuit including CMOS inverter circuits and feedback paths. FIGS. 1B and 1C illustrate exemplary CMOS inverter circuits.

Referring to FIG. 1A, the latch circuit includes four inverter circuits IV11, IV12, IV21, and IV22. The inverter circuits IV11, IV12, IV21, and IV22 are each realized by, for example, the CMOS inverter circuit in FIG. 1B in which one P-channel transistor PTr is coupled in series to one N-channel transistor NTr, or the CMOS inverter circuit in FIG. 1C in which two P-channel transistors PTr are coupled in series to two N-channel transistors NTr. Alternatively, a combination of the CMOS inverter circuits illustrated in FIGS. 1B and 1C may make up each of the inverter circuits IV11, IV12, IV21, and IV22.

Although two output terminals 2 and 2' through which output data Dout and inverted output data /Dout are output, respectively, are provided in the examples in FIGS. 1A to 1C, one output terminal may be provided. In addition, although the non-inverted output data Dout and the inverted output data /Dout are output as the output data in the examples in FIGS. 1A to 1C, two non-inverted outputs Dout or two inverted outputs /Dout may be output from different nodes. Furthermore, although one input terminal 1 through which input data Din is received is provided in the examples in FIG. 1A to 1C, multiple segments of the same input data may be input through the input terminal 1 or non-inverted input data and inverted input data may be input through the input terminal 1.

Figure 2:
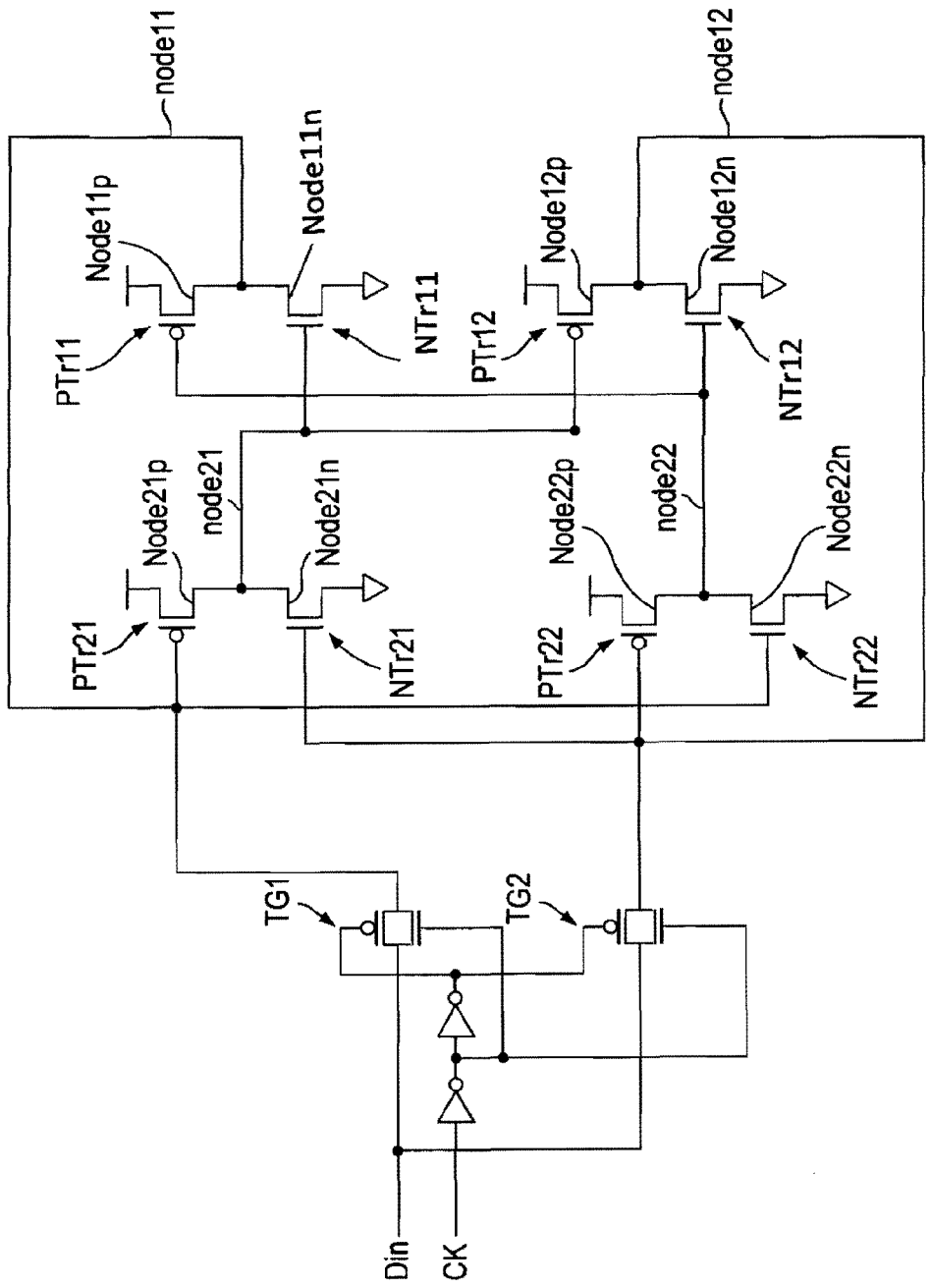
FIG. 2 illustrates a specific example of the circuit configuration of the latch circuit in FIG. 1A.

FIG. 2 illustrates a specific example of the circuit configuration of the latch circuit in FIG. 1A. In the circuit configuration in FIG. 2, the inverter circuits IV11, IV12, IV21, and IV22 are each realized by the CMOS inverter circuit illustrated in FIG. 1B. In addition, two transfer gates TG1 and TG2 are provided at the input side in the circuit configuration in FIG. 2. The input data Din is divided into two data segments. One of the two data segments is input into the inverter circuit IV21 through the transfer gate TG1, and the other of the two data segments is input into the inverter circuit IV22 through the transfer gate TG2. The transfer gates TG1 and TG2 are controlled by using a clock signal CK. Accordingly, in the circuit illustrated in FIG. 2, the same input data Din is input into the inverter circuits IV21 and IV22.

The inverter circuits IV11, IV12, IV21, and IV22 are each made up of the CMOS inverter circuit in which the P-channel transistor PTr is coupled in series to the N-channel transistor NTr. Here, the output node of the P-channel transistor PTr21 and the N-channel transistor NTr21 making up the inverter circuit IV21 is denoted by node21, and the drains of the P-channel transistor PTr21 and the N-channel transistor NTr21 are denoted by Node21p and Node21n, respectively. Similarly, the output node of the P-channel transistor PTr22 and the N-channel transistor NTr22 making up the inverter circuit IV22 is denoted by node22, and the drains of the P-channel transistor PTr22 and the N-channel transistor NTr22 are denoted by Node22p and Node22n, respectively. The output node of the P-channel transistor PTr11 and the N-channel transistor NTr11 making up the inverter circuit IV11 is denoted by node11, and the drains of the P-channel transistor PTr11 and the N-channel transistor NTr11 are denoted by Node11p and Node11n, respectively. The output node of the P-channel transistor PTr12 and the N-channel transistor NTr12 making up the inverter circuit IV12 is denoted by node12, and the drains of the P-channel transistor PTr12 and the drain of the N-channel transistor NTr12 are denoted by Node12p and Node12n, respectively.

The input data Din input through the transfer gate TG1 is supplied to the gates of the P-channel transistor PTr21 and the N-channel transistor NTr22 and is also supplied to the output node node11. The input data Din input through the transfer gate TG2 is supplied to the gates of the N-channel transistor NTr21 and the P-channel transistor PTr22 and is also supplied to the output node node12. The output node node21 is coupled to the gates of the N-channel transistor NTr11 and the P-channel transistor PTr12. The output node node22 is coupled to the gates of the P-channel transistor PTr11 and the N-channel transistor NTr12. The output terminals are coupled to, for example, the output node node21 and/or the output node node22.

In the circuit configuration in FIG. 2, when the clock signal CK changes from a "H" state to an "L" state, the transfer gates TG1 and TG2 change from a cut-off state to a conduction state and the input data Din is input into the latch circuit. When the clock signal CK changes from the "L" state to the "H" state, the transfer gates TG1 and TG2 return to the cut-off state to hold the input data Din. In other words, the latch circuit latches the input data Din. Since the transfer gates TG1 and TG2 keep the cut-off state while the clock signal CK is in the "H" state, the data held in the latch circuit is not changed even if the input data Din is changed.

In the latch circuit in FIG. 2, even if a soft error occurs in one of the CMOS inverter circuits, the remaining CMOS inverter circuits are not affected by the soft error and thus return the CMOS inverter circuit where the soft error has occurred to the original normal state.

Figure 3:
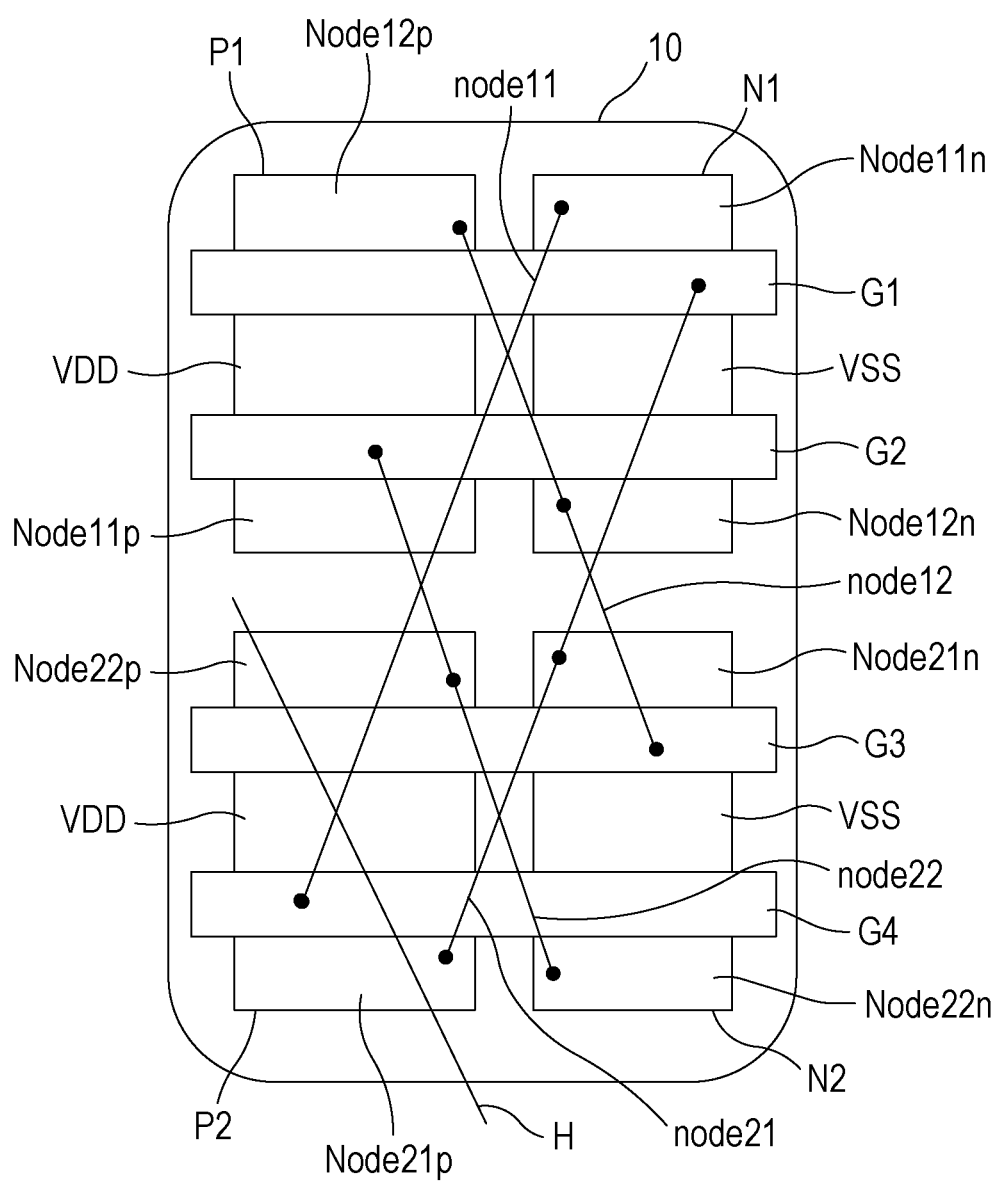
FIG. 3 illustrates an exemplary layout pattern in related art of the latch circuit in FIG. 2.
Figure 4:
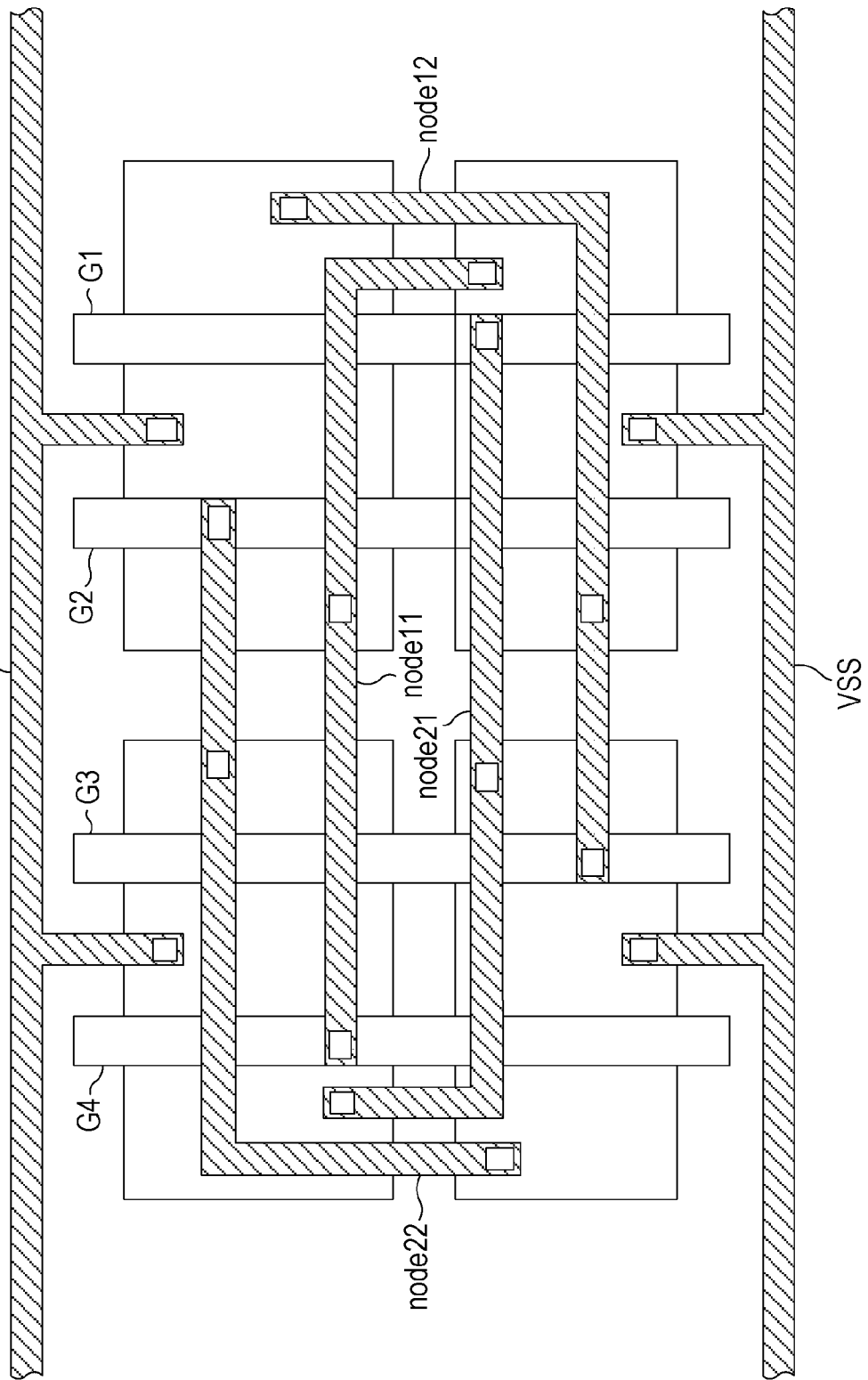
FIG. 4 illustrates the exemplary layout pattern in FIG. 3 in detail.

FIG. 3 illustrates an exemplary layout pattern indicating how to arrange the P-channel transistors PTr11, PTr12, PTr21, and PTr22 and the N-channel transistors NTr11, NTr12, NTr21, and NTr22 making up the latch circuit in FIG. 2. FIG. 4 illustrates an exemplary layout pattern indicating the arrangement and wiring of the circuit components in detail when the circuit in FIG. 2 is realized with the arrangement in FIG. 3.

Referring to FIG. 3, reference numeral 10 denotes a range in which the transistors in the circuit in FIG. 2 are arranged. In the range 10, pMOS regions (p wells) in which the P-channel transistors are formed are arranged in the left-side area and nMOS regions (n wells) in which the N-channel transistors are formed are arranged in the right-side area. Such regions are repeatedly arranged in the longitudinal and latitudinal directions in FIG. 3. The circuit in FIG. 2 is formed in two adjacent pMOS regions and two adjacent nMOS regions.

The P-channel transistors PTr12 and PTr11 are formed in the upper left pMOS region, the P-channel transistors PTr22 and PTr21 are formed in the lower left pMOS region, the N-channel transistors NTr11 and NTr12 are formed in the upper right nMOS region, and the N-channel transistors NTr21 and NTr22 are formed in the lower right nMOS region. A high-voltage-side power source VDD is coupled at the center of each pMOS region, and a low-voltage-side power source VSS is coupled at the center of each nMOS region to serve as the sources of the transistors. The power source wiring is omitted in FIGS. 3 and 4. Reference numeral G1 denotes the common gate of the P-channel transistor PTr12 and the N-channel transistor NTr11. Reference numeral G2 denotes the common gate of the P-channel transistor PTr11 and the N-channel transistor NTr12. Reference numeral G3 denotes the common gate of the P-channel transistor PTr22 and the N-channel transistor NTr21. Reference numeral G4 denotes the common gate of the P-channel transistor PTr21 and the N-channel transistor NTr22. As illustrated in FIG. 3, the drain Node12p of the P-channel transistor PTr 12 and the drain Node12n of the N-channel transistor NTr12 are coupled to the gate G3. Accordingly, this coupling wiring corresponds to the output node node12. Since the same applies to the other transistors, a detailed description of the other transistors is omitted herein.

Figure 5:
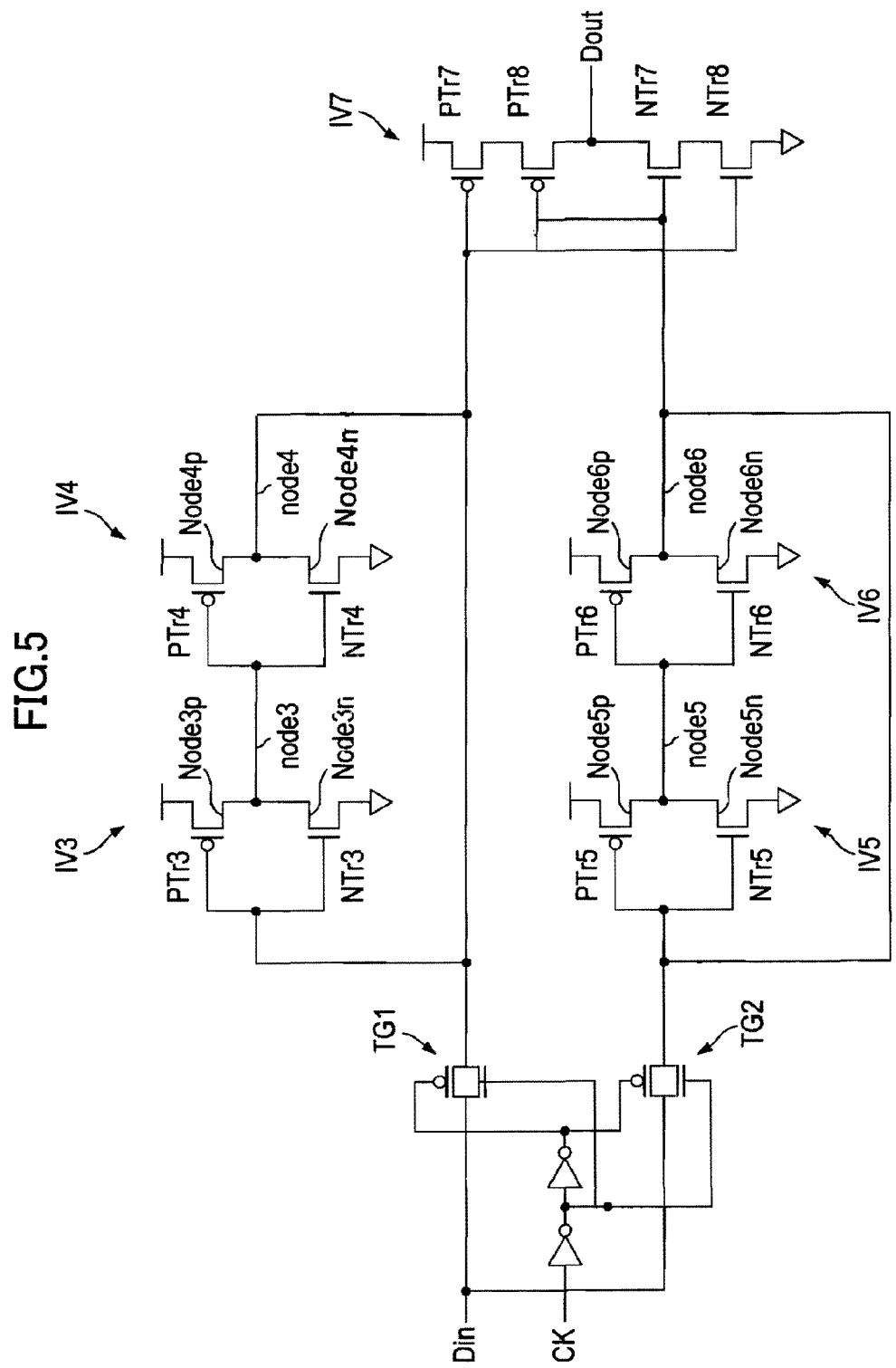
FIG. 5 illustrates another example of the circuit configuration of the latch circuit having the soft-error resistance.

FIG. 5 illustrates another example of the circuit configuration of the latch circuit that includes multiple CMOS inverter circuits and feedback paths through which and the multiple CMOS inverter circuits the input is fed back to the input to improve the soft-error resistance. The latch circuit in FIG. 5 includes an inverter circuit IV7 in which a P-channel transistor PTr7, a P-channel transistor PTr8, an N-channel transistor NTr7, and an N-channel transistor NTr8 are coupled in series to each other. The input data Din input through the transfer gate TG1 is applied to the gates of the P-channel transistor PTr7 and the N-channel transistor NTr8, and the input data Din input through the transfer gate TG2 is applied to the gates of the P-channel transistor PTr8 and the N-channel transistor NTr7. Accordingly, the latch circuit operates as an inverter circuit.

The latch circuit in FIG. 5 includes inverter circuits IV3 and IV4 that are coupled in series to each other. In the latch circuit in FIG. 5, the input data Din input through the transfer gate TG1 is supplied to the inverter circuit IV3 and the output from the inverter circuit IV4 is fed back to the input. Similarly, the latch circuit in FIG. 5 includes inverter circuits IV5 and IV6 that are coupled in series to each other. In the latch circuit in FIG. 5, the input data Din input through the transfer gate TG2 is supplied to the inverter circuit IV5 and the output from the inverter circuit IV6 is fed back to the input. The inverter circuits IV3 to IV6 are each formed of the CMOS inverter circuit in which the P-channel transistor PTr is coupled in series to the N-channel transistor NTr. Here, the output node of the P-channel transistor PTr3 and the N-channel transistor NTr3 forming the inverter circuit IV3 is denoted by node3, and the drains of the P-channel transistor PTr3 and the N-channel transistor NTr3 are denoted by Node3$p$ and Node3$n$, respectively. Similarly, the output node of the P-channel transistor PTr4 and the N-channel transistor NTr4 forming the inverter circuit IV4 is denoted by node4, and the drains of the P-channel transistor PTr4 and the N-channel transistor NTr4 are denoted by Node4$p$ and Node4$n$, respectively. The output node of the P-channel transistor PTr5 and the N-channel transistor NTr5 forming the inverter circuit IV5 is denoted by node5, and the drains of the P-channel transistor PTr5 and the N-channel transistor NTr5 are denoted by Node5$p$ and Node5$n$, respectively. The output node of the P-channel transistor PTr6 and the N-channel transistor NTr6 forming the inverter circuit IV6 is denoted by node6, and the drains of the P-channel transistor PTr6 and the N-channel transistor NTr6 are denoted by Node6$p$ and Node6$n$, respectively.

In the circuit configuration in FIG. 5, when the clock signal CK changes from the "H" state to the "L" state, the transfer gates TG1 and TG2 change from the cut-off state to the conduction state and the input data Din is input into the latch circuit. When the clock signal CK changes from the "L" state to the "H" state, the transfer gates TG1 and TG2 return to the cut-off state to hold the input data Din. In other words, the latch circuit latches the input data Din. Since the transfer gates TG1 and TG2 keep the cut-off state while the clock signal CK is in the "H" state, the data held in the latch circuit is not changed even if the input data Din is changed.

In the latch circuit in FIG. 5, even if a soft error occurs in one of the CMOS inverter circuits, the remaining CMOS inverter circuits are not affected by the soft error and thus return the CMOS inverter circuit where the soft error has occurred to the original normal state.

As described above, in each of the latch circuits in FIGS. 2 and 5, even if a soft error occurs in one of the CMOS inverter circuits, the remaining CMOS inverter circuits are not affected by the soft error and thus return the CMOS inverter circuit where the soft error has occurred to the original normal state. However, the circuit pattern is being reduced in size to realize, for example, a circuit having a line width of 45 nm or 32 nm. In such a miniature configuration, the probability of soft errors simultaneously occurring in two parts in the transistors forming the latch circuit is increased. For example, as illustrated in FIG. 3, a radiation ray H may be simultaneously incident on the drains Node21$p$ and Node22$p$ to simultaneously cause soft errors in both of the output nodes node21 and node22. An error may occur in the data held in the latch circuit in FIG. 2 if such two soft errors have occurred.

Next, cases will now be described in which soft errors occur in two or more nodes in each of the latch circuits illustrated in FIGS. 2 and 5 to cause an error in the data held in the latch circuit.

FIG. 6 illustrates a result of simulation of whether an error occurs in the held data if soft errors have simultaneously occurred in two nodes in the latch circuit in FIG. 2. As illustrated in FIG. 6, errors may not occur in all the combinations of the nodes but may occur in some combinations of the nodes. For example, if soft errors simultaneously occur in the drains Node21$p$ and Node22$p$, an error occurs in the held data. Similarly, if soft errors simultaneously occur in the drains Node21$p$ and Node12$n$, an error occurs in the held data. In contrast, no error may occur in the held data even if soft errors simultaneously occur in the drain Node21$p$ and a drain other than the drains Node22$p$ and Node12$n$.

FIG. 7 illustrates a result of simulation of whether an error occurs in the held data if soft errors have simultaneously occurred in two nodes in the latch circuit in FIG. 5. Combinations of the drains Node3$p$ and Node3$n$ are illustrated in FIG. 7. As illustrated in FIG. 7, errors may not occur in all the combinations of the nodes but may occur in some combinations of the nodes. For example, if soft errors simultaneously occur in the drain Node3$p$ and the drain Node5$p$ or Node6$n$, an error occurs in the held data. Similarly, if soft errors simultaneously occur in the drain Node3$n$ and the drain Node6$p$ or Node5$n$, an error occurs in the held data. Otherwise, no error occurs in the held data even if soft errors simultaneously occur in two parts.

Here, a simulation of whether an error occurs in the held data if a soft error occurs in another additional part is performed for the combinations of the nodes in which an error occurs in the held data when soft errors simultaneously occur in two parts. This simulation indicates that, in some combinations, an error occurs in the held data if soft errors occur in two parts but no error occurs in the held data if soft errors occur in three parts.

FIG. 8 illustrates combinations in which an error occurs in the held data if soft errors occur in two parts but no error occurs in the held data if soft errors occur in three parts, among the combinations concerning the drains Node21$n$ and Node21$p$ in the latch circuit in FIG. 2.

FIG. 9 illustrates combinations in which an error occurs in the held data if soft errors occur in two parts but no error occurs in the held data if soft errors occur in three parts, among the combinations concerning the drains Node3$p$ and Node3$n$ in the latch circuit in FIG. 5.

Results of consideration based on the above simulation results will now be described.

Soft errors occur in the drains of transistors. When the transistors receive α rays or neutron beams, the pMOS drains operate so as to collect positive holes while the nMOS drains operate so as to collect electrons. Accordingly, when a node coupled to a pMOS drain is in the "H" state, the pMOS drain collects positive holes and the node remains in the "H" state even if a soft error occurs in the pMOS drain. Similarly, when a node coupled to an nMOS drain is in the "L" state, the nMOS drain collects electrons and the node remains in the "L" state even if a soft error occurs in the nMOS drain. Consequently, it is generally said that positive (peak) noises changing from the "L" state to the "H" state occur in the pMOS drains while negative (valley) noises changing from the "H" state to the "L" state occur in the nMOS drains. Although this assumption has no problem if one soft error occurs, it is desirable to pay attention to inhibitory effects due to the soft error occurring in the node whose state is not changed if soft errors occur in two or more nodes. Accordingly, it is necessary to consider the negative (valley) noises changing from the "H" state to the "L" state in the pMOS drains and the positive (peak) noises changing from the "L" state to the "H" state in the nMOS drain.

In the latch circuit in FIG. 2, different signals having the same data are applied to the P-channel transistor PTr and the N-channel transistor NTr in each inverter circuit. Accordingly, the data held in the latch circuit is not changed if one soft error occurs. If soft errors occur in two parts, the held data is changed in combinations in which both of the P-channel transistor PTr and the N-channel transistor NTr making up one inverter circuit are changed. For example, the data in the output node node11 is determined by the P-channel transistor PTr11 the gate of which is coupled to the output node node22 and the N-channel transistor NTr11 the gate of which is coupled to the output node node11. Accordingly, if both of the data of the output node node11 and the data of the output node node22 are changed due to soft errors, the data of the output node node11 is changed and the change in the data of the output node node11 is propagated to the other parts to change the data held in the latch circuit. The two soft errors changing both of the data of the output node node11 and the data of the output node node22 are two soft errors occurring in the drain Node21p and the drain Node22p or two soft errors occurring in the drain Node21n and the drain Node22n. The data of the output node node11 is also changed in these combinations. Similarly, the two soft errors occurring in the drain Node11p and the drain Node12p or the two soft errors occurring in the drain Node11n and the drain Node12n change the data of the output node node11 and the output node node22.

In addition, if the data of the output node node11 is also changed due to a soft error when the state of the P-channel transistor PTr11 is changed due to a soft error, the state of the N-channel transistor NTr11 is changed to change the data of the output node node11. As described above, when the output node node11 is in the "L" state, the data of the output node node11 is changed if a soft error occurs in the P-channel transistor PTr11 and the output node node11 is in the "H" state. The soft error causing the output node node11 to change from the "H" state to the "L" state occurs in the N-channel transistor NTr21. The soft errors occurring in the drain Node21n and the drain Node11p change the data held in the inverter circuit in the above manner. Similarly, the soft errors occurring in the drain Node11n and the drain Node22p, the soft errors occurring in the drain Node12n and the drain Node21p, and the soft errors occurring in the drain Node22n and the drain Node12p change the data held in the inverter circuit.

The above operation corresponds to the relationship illustrated in FIG. 6. In addition, the above operation agrees with the relationship illustrated in FIG. 7 indicating whether the held data is changed due to a soft error occurring in the latch circuit in FIG. 5.

As described above, although the data held in the latch circuit is changed if soft errors occur in the drain Node21p and the drain Node22p, the data held in the latch circuit is not changed if an additional soft error occurs in the drain Node21n, as illustrated in FIG. 8. This is because the drain Node21p collects positive holes to cause the output node node21 to be temporarily changed to the "H" state if a soft error occurs in the drain Node21p when the output node node21 is in the "L" state and the drain Node21n collects electrons to cause the output node node21 to be temporarily changed to the "L" state if a soft error occurs in the drain Node21n in the above state. Since the above operation of the drain Node21p is opposite to the operation of the drain Node21n to offset the operation of the drain Node21n, the data of the output node node21 is not changed. Accordingly, if a soft error occurs in the drain Node21n when soft errors occur in the drain Node21p and the drain Node22p, the data held in the inverter circuit is not changed.

An exemplary arrangement to cause a soft error to occur in the drain Node21n when soft errors occur in the drain Node21p and the drain Node22p will now be considered. The radiation ray causing a soft error goes straight to be incident on the drain of each transistor. Accordingly, arranging the drains Node21p, Node21n, and Node22p on a straight line in this order causes a soft error to occur in the drain Node21n when soft errors occur in the drain Node21p and the drain Node22p.

Similarly, arranging the drains Node21p, Node22n, and Node22p on a straight line in this order causes a soft error to occur in the drain Node22n when soft errors occur in the drain Node21p and the drain Node22p. Similarly, arranging the drains Node11p, Node11n or Node12n, and Node22p on a straight line in this order reduces if not prevents the data held in the inverter circuit from being changed. This applies to the N-type drains.

FIGS. 10A and 10B illustrate the arrangements described above. The latch circuit in FIG. 2 includes the multiple CMOS inverter circuits and the input part receiving an external input signal. The external input signal is supplied to the multiple CMOS inverter circuits through the input part in the above configuration. Output signals from the multiple CMOS inverter circuits are supplied to a circuit (not illustrated) in the next stage and are also returned to the input part in the latch circuit through the feedback paths (the paths indicated by the output node node11 and the output node node12 in FIG. 2). In other words, the input signal is fed back to the input part through the multiple CMOS inverter circuits. Among the multiple CMOS inverter circuits, the CMOS inverter circuit IV21 (a first CMOS inverter circuit) made up of the P-channel transistor PTr21 and N-channel transistor NTr21 and the CMOS inverter circuit IV22 (a second CMOS inverter circuit) made up of the P-channel transistor PTr22 and the N-channel transistor NTr22 output inverted data with respect to the input. The CMOS inverter circuit IV21 and the CMOS inverter circuit IV22 forms a first group. The CMOS inverter circuit IV11 (a third CMOS inverter circuit) made up of the P-channel transistor PTr11 and N-channel transistor NTr11 and the CMOS inverter circuit IV12 (a fourth CMOS inverter circuit) made up of the P-channel transistor PTr12 and the N-channel transistor NTr12 output the same data as the input. The CMOS inverter circuit IV11 and the CMOS inverter circuit IV12 forms a second group. In this configuration, as illustrated in FIG. 10A, the N-polarity drain Node21n or Node22n in the two or more CMOS inverter circuits in the first group is arranged between the P-polarity drain Node21p and the P-polarity drain Node22p in the two or more CMOS inverter circuits in the first group. As illustrated in FIG. 10B, the P-polarity drain Node21p or Node22p in the two or more CMOS inverter circuits in the first group is arranged between the N-polarity drain Node21n and the N-polarity drain Node22n in the two or more CMOS inverter circuits in the first group.

It is desirable to use the arrangements illustrated in FIGS. 10A and 10B also in the second group. Although it is desirable to use such arrangements in all the combinations, the use of the above arrangement in some combinations may achieve the corresponding effects because the occurrences of soft errors are matters of probability.

In the circuit in FIG. 5, the CMOS inverter circuit IV3 made up of the P-channel transistor PTr3 and the N-channel transistor NTr3 and the CMOS inverter circuit IV5 made up of the P-channel transistor PTr5 and the N-channel transistor NTr5 belong to the first group. In other words, the first group includes the CMOS inverter circuit IV3 and the CMOS inverter circuit IV5. The CMOS inverter circuit IV4 made up of the P-channel transistor PTr4 and the N-channel transistor NTr4 and the CMOS inverter circuit IV6 made up of the P-channel transistor PTr6 and the N-channel transistor NTr6 belong to the second group. In other words, the second group includes the CMOS inverter circuit IV4 and the CMOS inverter circuit IV6. Accordingly, it is desirable to use the above arrangements also in the latch circuit in FIG. 5.

Figure 11:
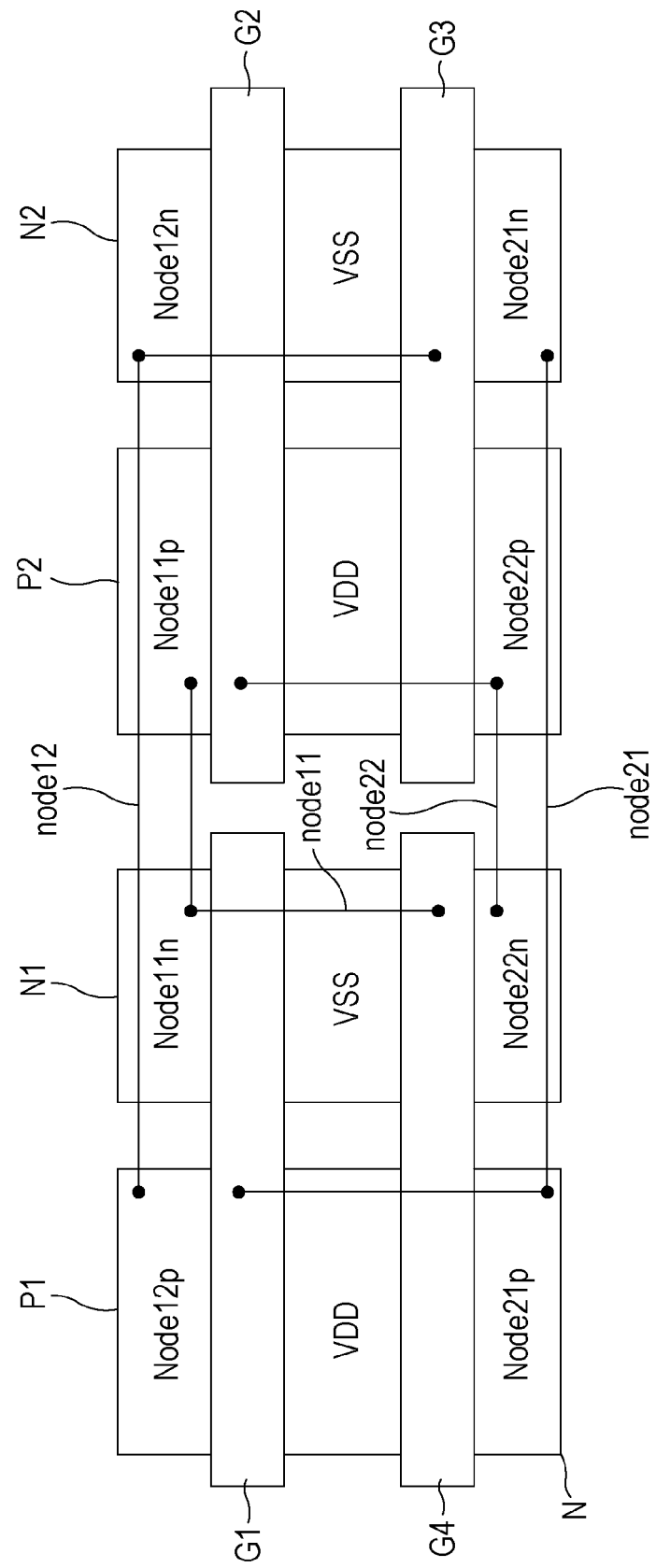
FIG. 11 illustrates an exemplary layout pattern of a latch circuit according to a first embodiment of the present invention.

FIG. 11 illustrates an exemplary layout pattern indicating how to arrange the transistors in a first embodiment in which the latch circuit in FIG. 2 is formed. The drains of the P-channel transistors PTr11, PTr12, PTr21, and PTr22 and the N-channel transistor NTr11, NTr12, NTr21, and NTr22 forming the latch circuit in FIG. 2 are arranged in the manner illustrated in FIG. 11.

Figure 12:
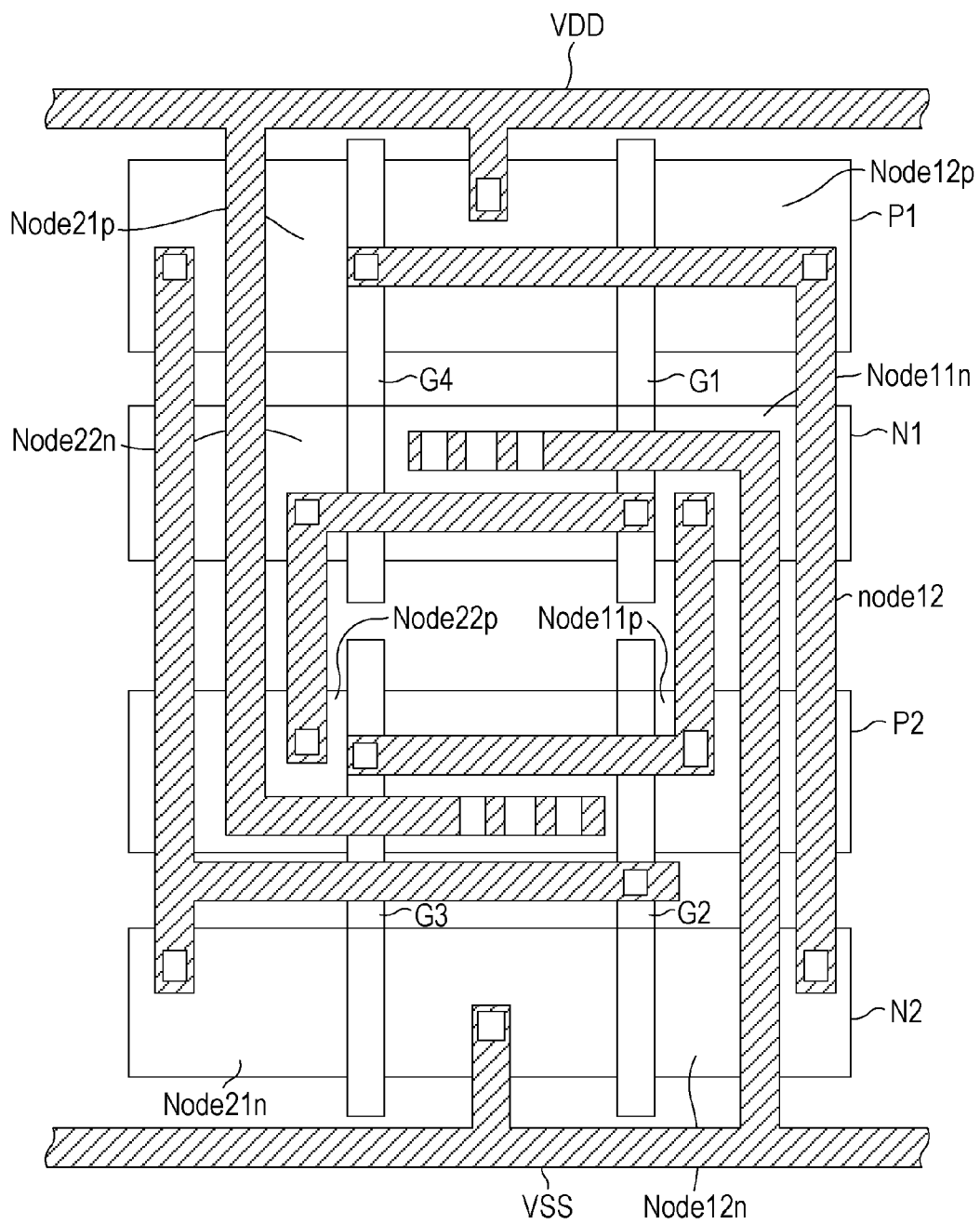
FIG. 12 illustrates an exemplary detailed layout pattern of the latch circuit according to the first embodiment of the present invention.

FIG. 12 illustrates an exemplary layout pattern indicating the arrangement and wiring of the circuit components in detail in the first embodiment in which the circuit in FIG. 2 is realized with the arrangement in FIG. 11.

As illustrated in FIGS. 11 and 12, pMOS regions (p wells) P1 and P2 in which the P-channel transistors are formed and nMOS regions (n wells) N1 and N2 in which the N-channel transistors are formed are alternately arranged. Specifically, the pMOS region P1, the nMOS region N1, the pMOS region P2, and the nMOS region N2 are arranged in this order.

The P-channel transistors PTr12 and PTr21 are formed in the pMOS region P1, the N-channel transistors NTr11 and NTr22 are formed in the nMOS region N1, the P-channel transistors PTr11 and PTr22 are formed in the pMOS region P2, and the N-channel transistors NTr12 and NTr21 are formed in the nMOS region N2. A high-voltage-side power source VDD is coupled at the center of each pMOS region and a low-voltage-side power source VSS is coupled at the center of each nMOS region to serve as the sources of the transistors. The power source wiring is omitted in FIG. 11. The high-voltage-side power source VDD and the low-voltage-side power source VSS are provided in the manner illustrated in FIG. 12. Reference numeral G1 denotes the common gate of the P-channel transistor PTr12 and the N-channel transistor NTr11. Reference numeral G2 denotes the common gate of the P-channel transistor PTr11 and the N-channel transistor NTr12. Reference numeral G3 denotes the common gate of the P-channel transistor PTr22 and the N-channel transistor NTr21. Reference numeral G4 denotes the common gate of the P-channel transistor PTr21 and the N-channel transistor NTr22. The drain Node12p of the P-channel transistor PTr12 and the drain Node12n of the N-channel transistor NTr12 are coupled to the gate G3. This connection wiring corresponds to the output node node12. The drain Node11p of the P-channel transistor PTr11 and the drain Node11n of the N-channel transistor NTr11 are coupled to the gate G4. This connection wiring corresponds to the output node node11. The drain Node21p of the P-channel transistor PTr21 and the drain Node21n of the N-channel transistor NTr21 are coupled to the gate G1. This connection wiring corresponds to the output node node21. The drain Node22p of the P-channel transistor PTr22 and the drain Node22n of the N-channel transistor NTr22 are coupled to the gate G2. This connection wiring corresponds to the output node node22.

As described above, although the data held in the latch circuit is changed if soft errors occur in the drain Node21p and the drain Node22p, the data held in the latch circuit is not changed if additional soft error occurs in the drain Node22n, as described above. In the layout pattern in FIG. 11, the drains Node21p, Node22n, and Node22p are arranged on a straight line, and a soft error occurs in the drain Node22n if soft errors occur in the drains Node21p and Node22p. Accordingly, it is possible to reduce if not prevent a change in the data caused by the occurrence of soft errors in the drains Node21p and Node22p, that is, an occurrence of an error.

Similarly, since the drain Node11n is arranged between the drains Node21p and Node22p, it is possible to reduce if not prevent a change in the data caused by the occurrence of soft errors in the drains Node21p and Node22p. Furthermore, since the drain Node11p is arranged between the drains Node11n and Node12n, it is possible to reduce if not prevent a change in the data caused by the occurrence of soft errors in the drains Node11n and Node12n. Since the drain Node22p is arranged between the drains Node22n and Node21n, it is possible to reduce if not prevent a change in the data caused by the occurrence of soft errors in the drains Node22n and Node21n.

Similar effects are achieved by arranging the nMOS region N1, the pMOS region P1, the nMOS region N2, and the pMOS region P2 in this order.

Comparison between the layout pattern in FIG. 12 and the layout pattern in FIG. 4 indicates that the P regions in one column and the N regions in one column are used to form one latch circuit in the layout pattern in FIG. 4 while the P regions in two columns and the N regions in two columns are used to form one latch circuit in the layout pattern in FIG. 12 in the first embodiment. Accordingly, since the layout pattern in the first embodiment requires a larger amount of the power source lines from the high-voltage-side power source VDD and the low-voltage-side power source VSS, the design of the layout pattern in the first embodiment is complicated. However, the problems in design are being resolved due to progress in CAD systems and manufacturing process in recent years and, thus, the effects of reducing the amount of soft errors are more important than the problems in design.

Figure 13:
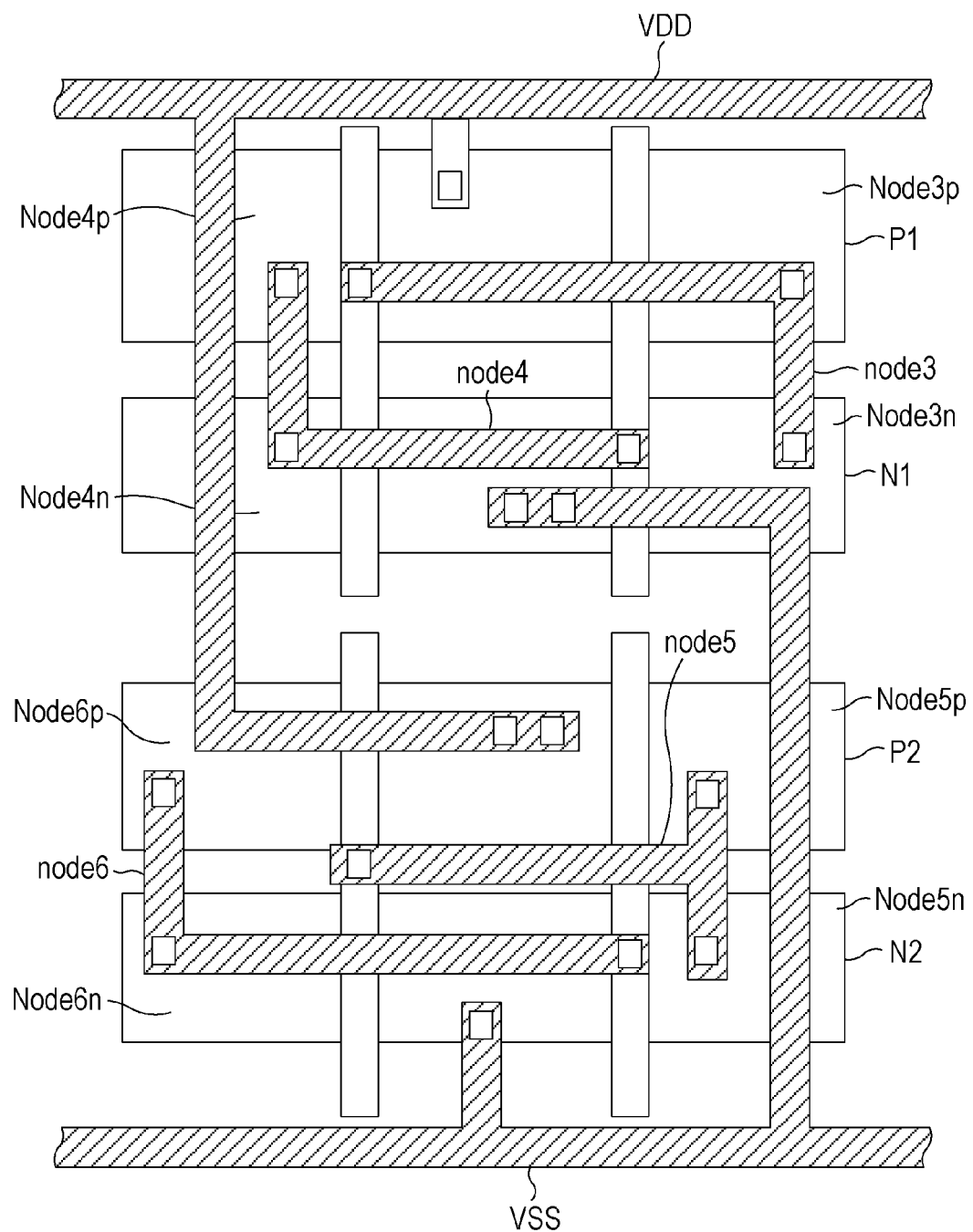
FIG. 13 illustrates an exemplary detailed layout pattern of a latch circuit according to a second embodiment of the present invention.

FIG. 13 illustrates an exemplary layout pattern indicating the arrangement and wiring of the transistors in a second embodiment in which the latch circuit in FIG. 5 is formed. Also in the second embodiment, pMOS regions (p wells) in which the P-channel transistors are formed and nMOS regions (n wells) in which the N-channel transistors are formed are alternately arranged. The drain Node3n is arranged between the drains Node3p and Node5p the data of which has an error if soft errors simultaneously occur in the two parts. Similarly, the drain Node4n is arranged between the drains Node4p and Node6p, the drain Node5p is arranged between the drains Node3n and Node5n, and the drain Node6p is arranged between the drains Node4n and Node6n. With this layout pattern, similar effects as in the first embodiment are achieved.

Figure 14:
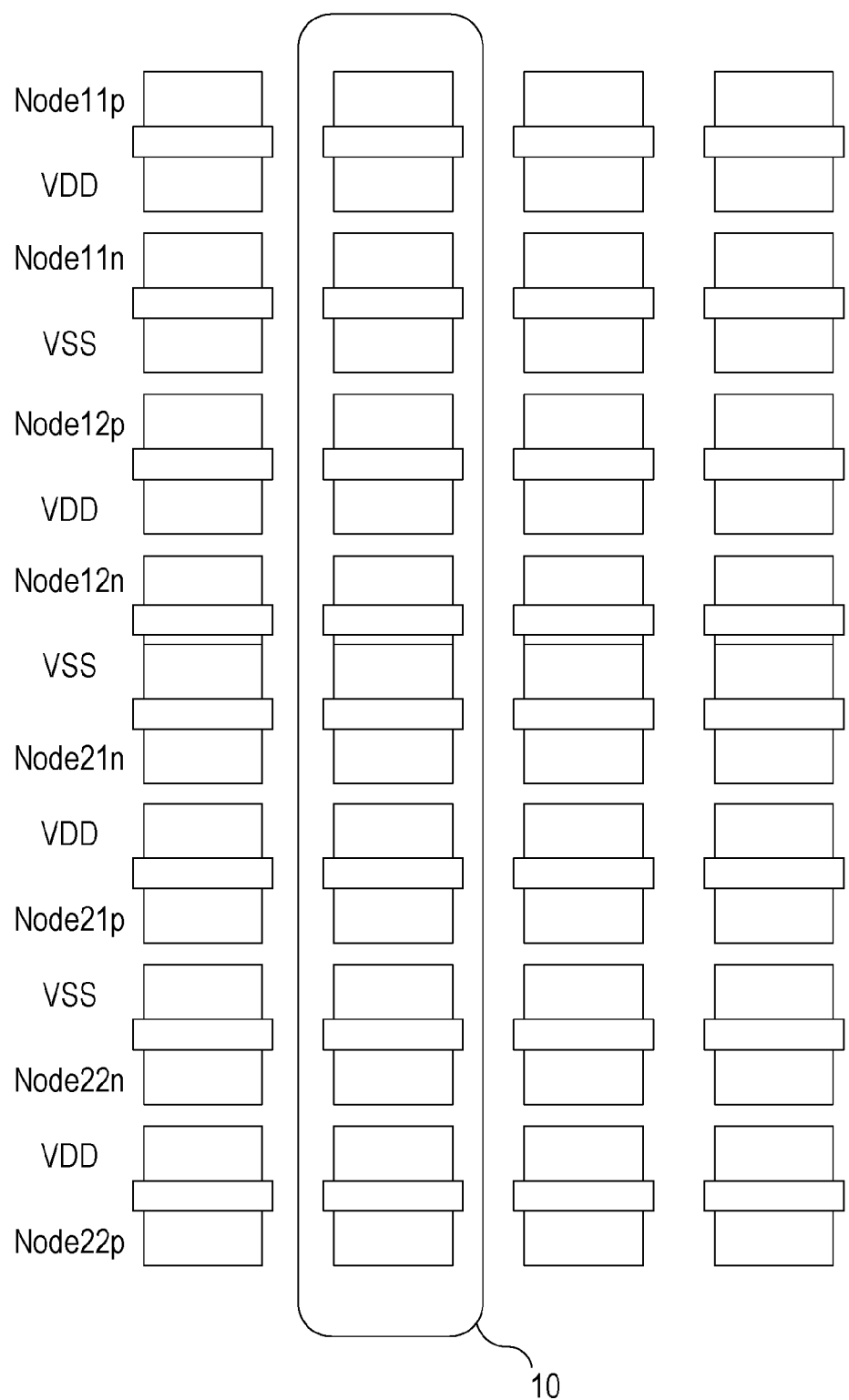
FIG. 14 illustrates an example of arrangement of nodes in a latch circuit according to a third embodiment of the present invention.

FIG. 14 illustrates an exemplary layout pattern indicating the arrangement of the sources and drains in a third embodiment in which the latch circuit in FIG. 2 is formed. In the third embodiment, the range 10, that is, the P regions in four columns and the N regions in four columns, which are alternately arranged, are used to form the latch circuit in FIG. 2. Accordingly, the layout pattern becomes more complicated than the layout pattern in the first embodiment. However, it is possible to further suppress the occurrence of soft errors in the third embodiment, compared with the first embodiment.

In the first embodiment, it is difficult to prevent a change in the data held in the latch circuit if soft errors simultaneously occur in the drains Node11n and Node22p, in the drains Node12n and Node21p, in the drains Node21n and Node11p, and in the drains Node22n and Node12p. In contrast, in the third embodiment, the nodes in the above combinations are arranged apart and a node offsetting the soft errors occurring in the nodes is arranged between the nodes in each combination. For example, the drain Node21n is arranged between the drains Node12n and Node21p that are most closely arranged. Accordingly, a soft error occurs in the drain Node21n if soft errors occur in the drains Node12n and Node21p. Since the soft error occurring in the drain Node21n operates so as to offset the soft error in the drain Node21p, a change in the data held in the latch circuit is suppressed.

As described above, the layout pattern in the third embodiment is applicable to, for example, cases in which strict specifications are desired for the soft errors.

Although the latch circuits are exemplified in the above description, the configurations in the above embodiments are applicable to, for example, flip-flops in which latch circuits are coupled.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A latch circuit comprising:
an input part receiving an external input signal;
a plurality of CMOS inverter circuits divided into a first group that includes a first CMOS inverter circuit and a second CMOS inverter circuit outputting inverted data with respect to the external input signal, and a second group that includes a third CMOS inverter circuit and a fourth CMOS inverter circuit outputting the same data as the external input signal; and
a feedback path through which the external input signal is fed back to the input part via the plurality of CMOS inverter circuits,
wherein
a first pMOS region, a first nMOS region, a second pMOS region, and a second nMOS region are arranged in the semiconductor substrate in order,
the first CMOS inverter circuit includes a first P-polarity drain formed in the first pMOS region and a first N-polarity drain formed in the second nMOS region, and
the second CMOS inverter circuit includes a second P-polarity drain formed in the second pMOS region and a second N-plurality drain formed in the first nMOS region.

2. The latch circuit according to claim 1,
wherein
the third CMOS inverter circuit includes a third P-polarity drain formed in the second pMOS region and a third N-polarity drain formed in the first nMOS region, and
the fourth CMOS inverter circuit includes a fourth P-polarity drain formed in the first pMOS region and a fourth N-polarity drain formed in the second nMOS region.

3. The latch circuit according to claim 2, wherein
the first P-polarity drain is adjacent to the second N-polarity drain, and
the second P-polarity drain is adjacent to the first N-polarity drain, and
the third P-polarity drain is adjacent to the fourth N-polarity drain, and
the fourth P-polarity drain is adjacent to the third N-polarity drain.

4. The latch circuit according to claim 1,
wherein the first CMOS inverter circuit and the second CMOS inverter circuit use a common gate over the first pMOS region and the first nMOS region.

5. The latch circuit according to claim 1,
wherein the first CMOS inverter circuit and the second CMOS inverter circuit use a common gate over the second pMOS region and the second nMOS region.

6. The latch circuit according to claim 1,
wherein the output from the first CMOS inverter circuit is coupled to the gate of a second-polarity transistor in the third CMOS inverter circuit and the gate of a first-polarity transistor in the fourth CMOS inverter circuit,
wherein the output from the second CMOS inverter circuit is coupled to the gate of a first-polarity transistor in the third CMOS inverter circuit and the gate of a second-polarity transistor in the fourth CMOS inverter circuit,
wherein the output from the third CMOS inverter circuit is coupled to the gate of a first-polarity transistor in the first CMOS inverter circuit and the gate of a second-polarity transistor in the second CMOS inverter circuit, and
wherein the output from the fourth CMOS inverter circuit is coupled to the gate of a second-polarity transistor in the first CMOS inverter circuit and the gate of a first-polarity transistor in the second CMOS inverter circuit.

7. The latch circuit according to claim 6,
wherein the input part includes the gates of the first-polarity transistor in the first CMOS inverter circuit and the second-polarity transistor in the second CMOS inverter circuit and the gates of the second-polarity transistor in the first CMOS inverter circuit and the first-polarity transistor in the second CMOS inverter circuit.

8. The latch circuit according to claim 1, further comprising:
an output part externally outputting an output signal,
wherein the output from the first CMOS inverter circuit is coupled to the input of the third CMOS inverter circuit,
wherein the output from the second CMOS inverter circuit is coupled to the input of the fourth CMOS inverter circuit,
wherein the output from the third CMOS inverter circuit is coupled to the input of an output circuit making up the output part and the input of the first CMOS inverter circuit, and wherein the output from the fourth CMOS inverter circuit is coupled to the input of the output circuit and the input of the second CMOS inverter circuit.

\* \* \* \* \*